US006700425B1

United States Patent
Pilling

(10) Patent No.: US 6,700,425 B1
(45) Date of Patent: Mar. 2, 2004

(54) MULTI-PHASE CLOCK GENERATORS THAT UTILIZE DIFFERENTIAL SIGNALS TO ACHIEVE REDUCED SETUP AND HOLD TIMES

(75) Inventor: David J. Pilling, Los Altos Hills, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 120 days.

(21) Appl. No.: 10/017,628

(22) Filed: Oct. 30, 2001

(51) Int. Cl.[7] ................................................. H03K 3/00

(52) U.S. Cl. ....................................... 327/291; 327/292

(58) Field of Search ................................ 327/291, 292, 327/293, 294, 295, 296, 115, 117, 197, 202, 203, 218, 208, 209, 210, 211, 212; 377/47, 48

(56) References Cited

U.S. PATENT DOCUMENTS

| | | | |
|---|---|---|---|
| 4,386,271 A | 5/1983 | Chiang et al. ............... 250/234 |
| 4,623,801 A | 11/1986 | Rocchi ........................ 327/115 |
| 4,656,649 A * | 4/1987 | Takahashi ................... 327/115 |
| 4,689,497 A | 8/1987 | Umeki et al. ................ 327/202 |
| 4,764,901 A | 8/1988 | Sakurai .................. 365/189.05 |
| 4,797,575 A | 1/1989 | Lofgren ....................... 327/202 |
| 4,804,871 A | 2/1989 | Walters, Jr. ................... 327/54 |
| 5,007,023 A | 4/1991 | Kim et al. ................... 365/203 |
| 5,025,174 A | 6/1991 | Shikata ........................ 327/203 |
| 5,058,072 A | 10/1991 | Kashimura ................... 365/203 |
| 5,097,157 A | 3/1992 | Jaffe et al. ..................... 327/55 |
| 5,105,100 A | 4/1992 | Yamada ....................... 327/202 |
| 5,107,153 A | 4/1992 | Osaki et al. ................. 324/322 |
| 5,117,124 A | 5/1992 | Dicke .......................... 327/212 |
| 5,172,011 A | 12/1992 | Leuthold et al. ............. 327/202 |
| 5,200,650 A * | 4/1993 | Cowley et al. .............. 327/115 |
| 5,228,106 A | 7/1993 | Ang et al. .................... 365/208 |
| 5,233,638 A | 8/1993 | Moriwaki et al. ............. 377/55 |
| 5,249,214 A | 9/1993 | Ulmer et al. ................. 377/121 |
| 5,281,865 A | 1/1994 | Yamashita et al. ........... 327/208 |
| 5,323,065 A | 6/1994 | Ebihara et al. .............. 327/202 |
| 5,325,335 A | 6/1994 | Ang et al. .................... 365/205 |
| 5,327,019 A | 7/1994 | Kluck .......................... 327/202 |
| 5,357,144 A | 10/1994 | Tanaka ........................ 327/202 |
| 5,406,134 A | 4/1995 | Menut ......................... 327/203 |
| 5,406,216 A | 4/1995 | Millman et al. ............. 327/202 |
| 5,416,362 A | 5/1995 | Byers et al. ................. 327/202 |
| 5,455,531 A | 10/1995 | Morisaki ..................... 327/149 |
| 5,497,114 A | 3/1996 | Shimozono et al. ........ 327/202 |
| 5,497,115 A | 3/1996 | Millar et al. ................. 327/211 |
| 5,576,651 A | 11/1996 | Phillips ....................... 327/202 |
| 5,577,075 A | 11/1996 | Cotton et al. ................ 375/356 |
| 5,585,747 A | 12/1996 | Proebsting ..................... 327/55 |
| 5,656,962 A | 8/1997 | Banik .......................... 327/202 |
| 5,663,669 A | 9/1997 | Vanderschaaf .............. 327/201 |
| 5,699,002 A | 12/1997 | Hayakawa ................... 327/202 |
| 5,703,513 A | 12/1997 | Hashizume et al. ......... 327/202 |
| 5,708,380 A | 1/1998 | Farwell ........................ 327/202 |
| 5,712,584 A | 1/1998 | McClure ...................... 327/198 |
| 5,719,878 A | 2/1998 | Yu et al. ...................... 714/726 |

(List continued on next page.)

Primary Examiner—Timothy P. Callahan
Assistant Examiner—Linh Nguyen
(74) Attorney, Agent, or Firm—Myers Bigel Sibley & Sajovec

(57) ABSTRACT

Multi-phase clock generators include a master-slave flip flop that generates a second pair of clock signals having a second frequency in response to a first pair of clock signals having a first frequency greater than the second frequency. The master-slave flip-flop includes a master stage that is responsive to a first one of the first pair of clock signals and has a first pair of differential inputs and a first pair of differential outputs. A slave stage is also provided. The slave stage is responsive to a second one of the first pair of clock signals and has a second pair of differential inputs coupled to the first pair of differential outputs and a second pair of differential outputs that are cross-coupled and fed back to the first pair of differential inputs of the master stage.

17 Claims, 10 Drawing Sheets

U.S. PATENT DOCUMENTS

| | | | |
|---|---|---|---|
| 5,748,522 A | 5/1998 | Piguet et al. | 365/154 |
| 5,754,070 A | 5/1998 | Baumann et al. | 327/198 |
| 5,781,053 A | 7/1998 | Ramirez | 327/215 |
| 5,786,719 A | 7/1998 | Furutani | 327/202 |
| 5,789,957 A | 8/1998 | Fucili et al. | 327/203 |
| 5,801,565 A | 9/1998 | Kuo | 327/202 |
| 5,818,273 A | 10/1998 | Orgill et al. | 327/199 |
| 5,818,293 A | 10/1998 | Brehmer et al. | 327/202 |
| 5,821,791 A | 10/1998 | Gaibotti et al. | 327/202 |
| 5,864,252 A | 1/1999 | Tran et al. | 327/202 |
| 5,870,441 A | 2/1999 | Cotton et al. | 375/354 |
| 5,874,843 A | 2/1999 | Wang | 327/143 |
| 5,881,297 A | 3/1999 | McKenzie et al. | 713/322 |
| 5,886,931 A | 3/1999 | Hashiguchi | 365/189.05 |
| 5,898,330 A | 4/1999 | Klass | 327/210 |
| 5,917,355 A | 6/1999 | Klass | 327/208 |
| 5,933,038 A | 8/1999 | Klass | 327/208 |
| 5,943,386 A | 8/1999 | Chinn et al. | 327/116 |
| 5,945,858 A | 8/1999 | Sato | 327/202 |
| 5,982,309 A | 11/1999 | Xi et al. | 341/101 |
| 5,986,490 A | 11/1999 | Hwang et al. | 327/202 |
| 5,999,030 A | 12/1999 | Inoue | 327/202 |
| 6,002,284 A | 12/1999 | Hill et al. | 327/202 |
| 6,023,179 A | 2/2000 | Klass | 327/211 |
| 6,049,236 A | 4/2000 | Walden | 327/99 |
| 6,060,927 A | 5/2000 | Lee | 327/218 |
| 6,114,892 A | 9/2000 | Jin | 327/143 |
| 6,127,867 A | 10/2000 | Coughlin, Jr. et al. | 327/202 |
| 6,191,629 B1 | 2/2001 | Bisanti et al. | 327/202 |
| 6,198,323 B1 | 3/2001 | Offord | 327/202 |
| 6,198,324 B1 | 3/2001 | Schober | 327/202 |
| 6,414,529 B1 * | 7/2002 | Hirairi | 327/202 |

* cited by examiner

MULTI-PHASE CLOCK GENERATORS THAT UTILIZE DIFFERENTIAL SIGNALS TO ACHIEVE REDUCED SETUP AND HOLD TIMES

FIELD OF THE INVENTION the present invention relates to integrated circuit devices and, more particularly, to multi-phase clock generators.

BACKGROUND OF THE INVENTION

Integrated circuit chips typically utilize externally generated clock signals to generate on-chip clock signals that are utilized at the chop level and system level to achieve accurate synchronization of devices therein. These externally generated clock signal over a system board containing one or more interconnected chips that may need to communicate with each other in synchronization. The waveform of an externally generated clock signal typically cannot be used as an on-chip clock signal because only a single phase is typically available, its duty cycle typically cannot match the requirements of the chip logic and buffering is needed to drive large loads. According, on-chip clock generators are frequently provided to generate one or more internal clock signals having a high degree of synchronization with each other. Examples of techniques to synchronize clock signals at the chop and system level are more fully described at section 9.5 of a textbook by J. M. Rabaey, entitled Digital Integrated Circuits: A Design Perspective, Prentice-Hall, Inc., ISBN 0-13-178609-1, pp. 538–543 (1996).

On-chip clock generators may perform a divide-by-two function when generating a pair of internal clock signals and a divide-by-four function when generating two pairs of internal clock signals. One example of a divide-by-two clock generator is described in U.S. Pat. No. 5,249,214 to Ulmer et al., entitled "Low Skew CMOS Clock Divider." Another example of a divide-by-two clock generator is described in U.S. Pat. No. 6,049,236 to Walden, entitled "Divide-by-One or Divide-by-Two Qualified Clock Driver with Glitch-Free Transitions." Examples of conventional onchip clock generators that perform a divide-by-four function are illustrated by FIGS. 1A–1B.

In FIG. 1A, a plurality of identical D-type flip flops are utilized to generate a first pair of clock signals CLK2_R and CLK2_F in response to an external clock signal CLK. This first pair of clock signals have a frequency equal to one-half a frequency of the external clock signal CLK, with signals CLK2_R and CLK2_F being triggered on rising and falling edges of the external clock signal CLK, respectively. The clock generator of FIG. 1A also generates second and third pairs of clock signals (CLK4_0R, CLK4_2F) and (CLK4_1R, CLK4_3F), having frequencies that are equal to one-quarter a frequency of the external clock signal CLK. These divide-by-two and divide-by-four functions are achieved by feeding back the complementary output QB of each D-type flip-flop to its respective input (D). A reset feature is provided by an active low reset signal RESETB.

The clock generator of FIG. 1B is similar to the clock generator of FIG. 1A, however, the clock generator of FIG. 1B utilizes three D-type flip flops having complementary outputs (Q and QB) and three D-type flip flops having only single true outputs (Q). As illustrated, each complementary output QB of a flip flop is fed back to its respective input and every true output Q of the flip flops having dual outputs is connected to a data input of a respective flip flop having only a single output, as illustrated. Unfortunately, the clock generators of FIGS. 1A–1B may have unnecessarily long setup and hold times if the dynamic switching performance of each D-type flip flop is not sufficiently uniform and fast. For example, a full low-to-high or high-to-low signal swing is needed at each data input (D) of each D-type flip flop before it can be latched by the respective clock signal.

SUMMARY OF THE INVENTION

Multi-phase clock generators having improved setup and hold time characteristics according to a first embodiment of the present invention include a master-slave flip flop that generates a second pair of clock signals having a second frequency in response to a first pair of clock signals having a first frequency greater than the second frequency. The master-slave flip-flop includes a master stage that is responsive to a first one of the first pair of clock signals and has a first pair of differential inputs and a first pair of differential outputs. A slave stage is also provided. The slave stage is responsive to a second one of the first pair of clock signals and has a second pair of differential inputs coupled to the first pair of differential outputs and a second pair of differential outputs that are cross-coupled and fed back to the first pair of differential inputs of the master stage.

The first pair of clock signals are preferably a first pair of complementary clock signals, with the master stage including a master differential amplifier circuit that is responsive to a true one of the first pair of complementary clock signals and a master pair of cross-coupled logic gates having inputs electrically coupled to differential outputs of the master differential amplifier circuit. These cross-coupled logic gates may constitute two-input NAND gates. The master stage may also include an equalization circuit that is responsive to the true one of the first pair of complementary clock signals and is electrically coupled across the differential outputs of the master differential amplifier circuit. A precharge circuit is also provided. The precharge circuit is also responsive to the true one of the first pair of complementary clock signals and may include a pair of PMOS pull-up transistors electrically coupled to the differential outputs of the master differential amplifier circuit. Because the first pair of differential inputs associated with the master stage, which are cross-coupled to the second pair of differential outputs of the slave stage, typically require only about 100 mV differential voltage prior to a leading edge of the true one of the first pair of complementary clock signals, reduced setup times can be achieved. Reduced hold times may also be simultaneously achieved by reducing the loading on the inputs and outputs of the cross-coupled logic gates.

According to still further aspects of this embodiment, the slave stage preferably includes a slave differential amplifier circuit that is responsive to a complementary one of the first pair of complementary clock signals. The slave stage also includes a slave pair of cross-coupled logic gates having inputs electrically coupled to differential outputs of the slave differential amplifier circuit.

A multi-phase clock generator according to another embodiment of the present invention may include a complementary clock generator that generates true and complementary clock signals that are about 180° out-of-phase relative to each other. A master latched sense amplifier and a slave latched sense amplifier are also provided. The master latched sense amplifier is responsive to the true clock signal and has a first pair of differential inputs and a first pair of latched differential outputs. The slave latched sense amplifier is responsive to the complementary clock signal and has a second pair of differential inputs electrically coupled to the first pair of latched differential outputs and a second pair of latched differential outputs electrically cross-coupled and fed back to the first pair of differential inputs.

According to still another embodiment of the present invention, a divide-by-four clock generator having excellent setup and hold time characteristics includes a first divide-by-two clock generator that is responsive to a primary clock signal. The first divide-by-two clock generator includes a master latched sense amplifier and a slave latched sense amplifier. The master latched sense amplifier includes a first pair of differential inputs and a first pair of latched differential outputs. The slave latched sense amplifier has a second pair of differential inputs electrically coupled to the first pair of latched differential outputs and a second pair of latched differential outputs that are electrically cross-coupled and fed back to the first pair of differential inputs of the master latched sense amplifier. Second and third divide-by-two clock generators are also provided. The second divide-by-two clock generator has a clock input electrically coupled to one of the first pair of latched differential outputs generated by the master latched sense amplifier within the first divide-by-two clock generator. The third divide-by-two clock generator has a clock input electrically coupled to one of the second pair of latched differential outputs -generated by the slave latched sense amplifier within the first divide-by-two clock generator. The second and third divide-by-two clock generators may be similar in construction to the first divide-by-two clock generator.

According to a preferred aspect of this embodiment, the clock input of the second divide-by-two clock generator is electrically coupled to a complementary one of the first pair of latched differential outputs generated by the master latched sense amplifier within the first divide-by-two clock generator. In addition, the clock input of the third divide-by-two clock generator is electrically coupled to a true one of the second pair of latched differential outputs. To provide a preferred reset feature independent of the state of the primary clock signal, first and second MOS transistors may be provided within the first divide-by-two clock generator. The first MOS transistor may have a first current carrying terminal electrically connected to a true one of the first pair of latched differential outputs and a gate responsive to a reset signal. The second MOS transistor may have a first current carrying terminal electrically connected to the true one of the second pair of latched differential outputs and a gate responsive to the reset signal. These MOS transistors may comprise NMOS pull-down transistors. The second and third divide-by-two clock generators may have similar reset circuitry.

DESCRIPTION OF PREFERRED EMBODIMENTS

Figure 1A:
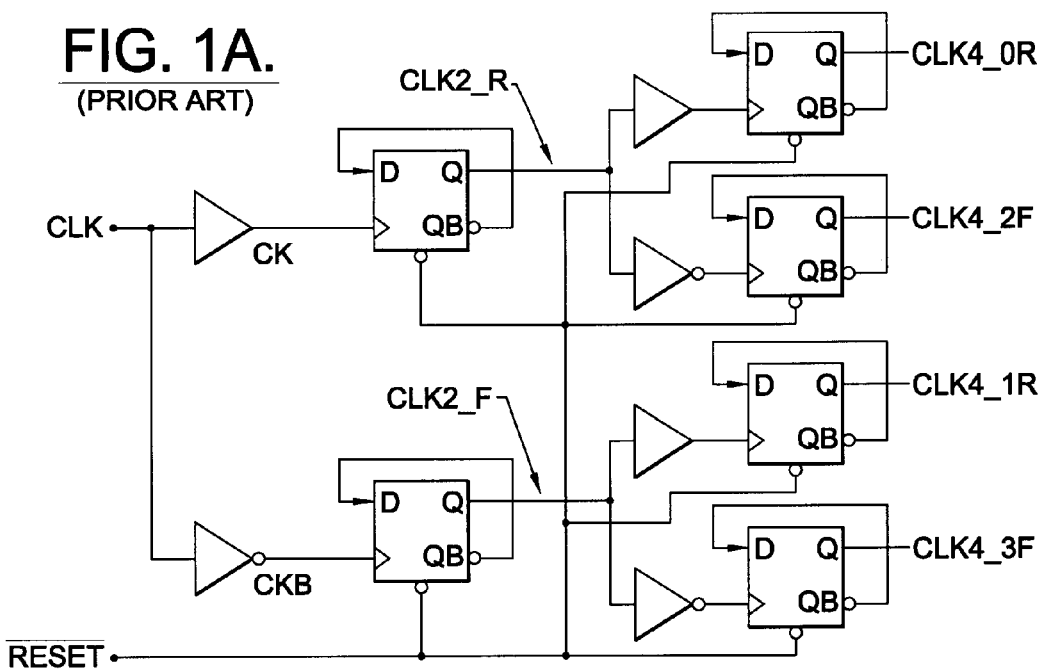
FIG. 1A is an electrical schematic of a divide-by-four clock generator according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be through and complete, and will fully convey the scope of the invention to those skilled in the art. Like reference numerals refer to like elements throughout and signal lines and signals thereon may be referred to by the same reference characters.

Figure 2:
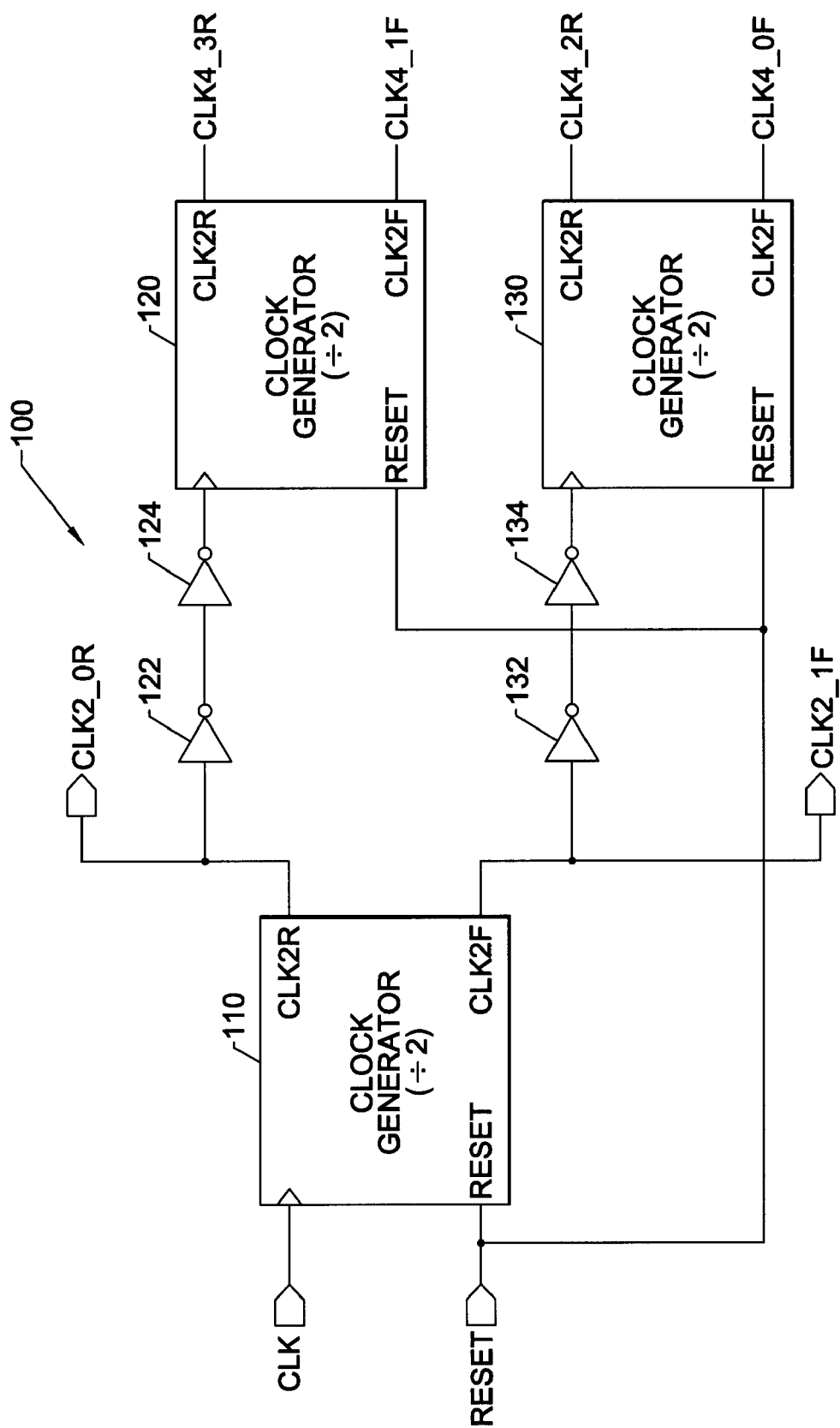
FIG. 2 is a block diagram of a four phase clock generator according to an embodiment of the present invention.

Referring now to FIG. 2, a four phase clock generator 100 according to a first embodiment of the present invention includes first, second and third divide-by-two clock generators 110, 120 and 130 connected as illustrated. The first divide-by-two clock generator 110 is responsive to a primary clock signal CLK and a reset signal RESET. The reset signal is also provided as a control input to the second and third divide-by-two clock generators 120 and 130. In response to the primary clock signal CLK, which may have a first frequency ($f_1$), the first divide-by-two clock generator 110 generates a first pair of clock signals CLK2_0R and CLK2_1F having a second frequency ($f_2$) that is less than the first frequency (e.g., $f_2=½f_1$). This first pair of clock signals CLK2_0R and CLK2_1F is generated at outputs CLK2R and CLK2F of the first divide-by-two clock generator 110. As described more fully hereinbelow with respect to FIG. 3A, the clock signal CLK2_0R has a period that is twice as long as the period of the primary clock signal CLK, with each rising and falling transition of CLK2_OR occurring in-sync with a respective rising edge of the primary clock signal CLK. The clock signal CLK2_1F also has a period that is twice as long as the period of the primary clock signal CLK, with each rising and falling transition of CLK2_1F occurring in-sync with a respective falling edge of the primary clock signal CLK.

The clock signal CLK2_OR is provided to the clock input of the second divide-by-two clock generator 120. To reduce timing skew that may be caused by excessive capacitive loading on the CLK2R output of the first divide-by-two clock generator 110, a first pair of serially-connected inverters 122 and 124 are provided as a non-inverting driver for passing the clock signal CLK2_OR to the primary clock input CLK of the second divide-by-two clock generator 120. The size of the second inverter in the first pair may be larger and have greater drive capability than the first inverter in the first pair. For purposes of illustration herein, the first pair of serially-connected inverters 122 and 124 will be treated as ideal inverters having zero delay. In response to the clock signal CLK2_OR, the second divide-by-two generator 120 will generate a second pair of clock signals having a third frequency ($f_3$) that is less than the second frequency (e.g., $f_3=½f_2$). This second pair of clock signals, shown as clock signals CLK4_3R and CLK4_1F, is generated at outputs CLK2R and CLK2_F of the second divide-by-two clock generator 120. As described more fully hereinbelow with respect to FIG. 3B, the clock signal CLK4_3R has a period that is four times as long as the period of the primary clock signal CLK, with each rising and falling transition of CLK4_3R occurring in-sync with a respective rising edge of the clock signal CLK2_0R. The clock signal CLK4_1F also has a period that is four times as long as the period of the primary clock signal CLK, with each rising and falling transition of CLK4_1F occurring in-sync with a respective falling edge of the clock signal CLK2_0R.

The clock signal CLK2_1F generated at the output CLK2F of the first divide-by-two generator 110 is provided to the clock input of the third divide-by-two clock generator 130. As illustrated, a second pair of serially-connected inverters 132 and 134 are provided as a non-inverting driver for passing the clock signal CLK2_1F to the primary clock input CLK of the third divide-by-two clock generator 130. The size of the second inverter in the second pair may be larger and have greater drive capability than the first inverter in the second pair. The second pair of serially-connected inverters 132 and 134 will be treated herein as ideal inverters having zero delay. In response to the clock signal CLK2_1F, the third divide-by-two generator 130 will generate a third pair of clock signals. This third pair of clock signals, shown as clock signals CLK4_2R and CLK4_0F, is generated at outputs CLK2R and CLK2F of the third divide-by-two clock generator 130. As described more fully hereinbelow with respect to FIG. 3C, the clock signal CLK4_2R has a period that is four times as long as the period of the primary clock signal CLK, with each rising and falling transition of CLK4_2R occurring in-sync with a respective rising edge of the clock signal CLK2_1F. The clock signal CLK4_0F also has a period that is four times as long as the period of the primary clock signal CLK, with each rising and falling transition of CLK4_0F occurring in-sync with a respective falling edge of the clock signal CLK2_1F.

Figure 3A:
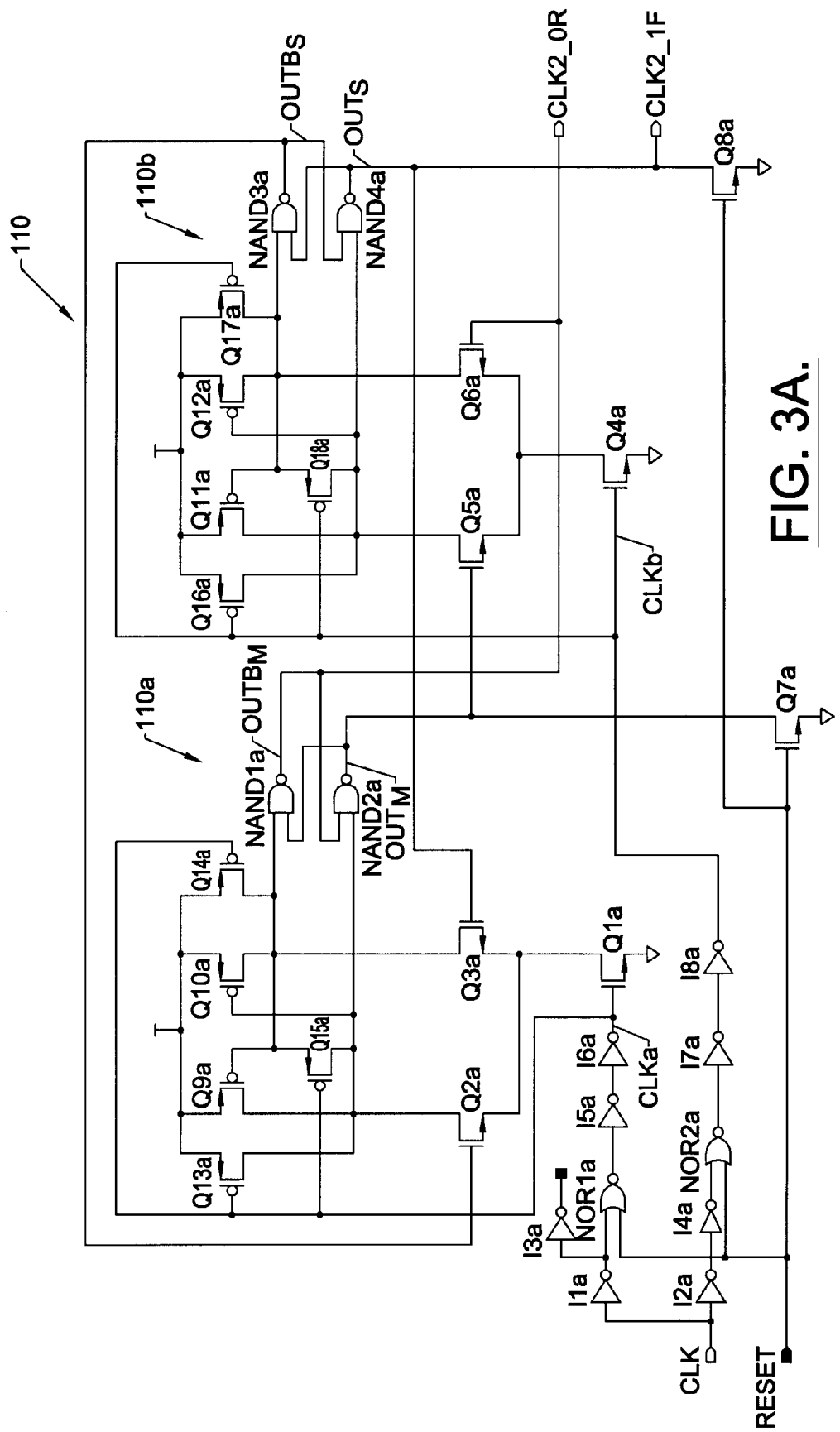
FIGS. 3A–3C are electrical schematics of divide-by-two clock generators according to embodiments of the present invention.

Referring now to FIG. 3A, a preferred embodiment of a first divide-by-two clock generator 110 according to the present invention will be described. This first divide-by-two clock generator 110 generates a first pair of clock signals CLK2_0R and CLK2_1F, in response to the primary clock signal CLK and the reset signal RESET. According to this embodiment, the clock signals CLK2_0R and CLK2_1F are complementary clock signals that are 180° out of phase relative to each other when the primary clock signal CLK has a 50% duty cycle. From this primary clock signal CLK, an internal pair of complementary clock signals CLKa and CLKb are generated by circuitry that includes a plurality of inverters 11a–18a and a plurality of NOR gates NOR1a–NOR2a. The inverter 13a, which has a floating output, is provided to equilibrate the delays associated with the generation of "true" clock signal CLKa and "complementary" clock signal CLKb. When the reset signal RESET is set to a logic 0 voltage, a rising transition of the primary clock signal CLK will result in a rising transition of the true clock signal CLKa and a falling transition of the complementary clock signal CLKb. When the active high reset signal RESET transitions from a logic 0 voltage to a logic 1 voltage, both the true clock signal CLKa and the complementary clock signal CLKb will be pulled (or held) low to a logic 0 voltage independent of the phase of the primary clock signal CLK.

Figure 1B:
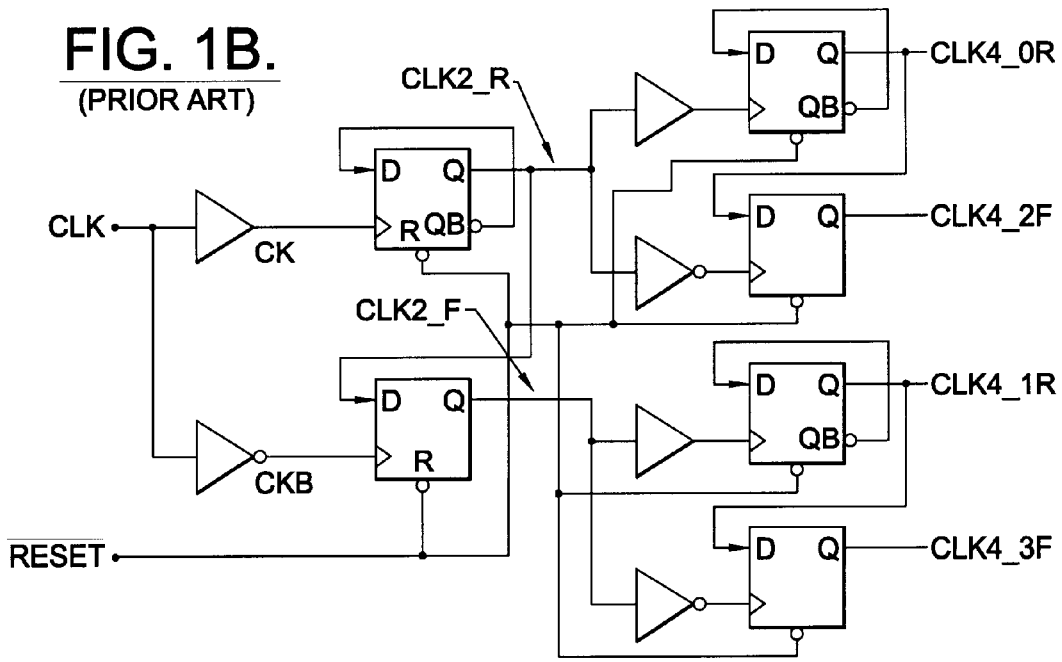
FIG. 1B is an electrical schematic of a divide-by-four clock generator according to the prior art.

The first divide-by-two clock generator 110 includes a master stage 110a and a slave stage 110b that collectively perform the operation of a master-slave flip-flop. The master stage 110a, which is responsive to the true clock signal CLKa, has a first pair of differential inputs and a first pair of differential outputs $OUT_M$ and $OUTB_M$. The slave stage 110b, which is responsive to the complementary clock signal CLKb, has a second pair of differential inputs that are electrically connected to the first pair of differential outputs $OUT_M$ and $OUTB_M$ and a second pair of differential outputs $OUT_S$ and $OUTB_S$ that are cross-coupled and fed back to the first pair of differential inputs of the master stage 110a. Because the first pair of differential inputs associated with the master stage typically require only about 100 mV differential voltage prior to a leading edge of the true clock signal CLKa, reduced setup times can be achieved relative to the clock generators of FIGS. 1A–1B. The master stage 110a includes a master differential amplifier circuit that is responsive to the true clock signal CLKa and a master pair of cross-coupled logic gates having inputs electrically coupled to differential outputs of the master differential amplifier circuit. The master differential amplifier circuit and the master pair of cross-coupled logic gates collectively form a master latched sense amplifier. The master differential amplifier circuit includes a NMOS clock enable transistor Q1a, first and second NMOS input transistors Q2a and Q3a and first and second PMOS load transistors Q9a and Q10a, connected as illustrated. The gates of the NMOS input transistors Q2a and Q3a receive the differential input signals to the master stage 110a. The drains of the first and second PMOS load transistors Q9a and Q10a represent the differential outputs of the master differential amplifier circuit.

The master stage 110a also includes an equalization circuit and a precharge circuit. The equalization circuit may include a single equalization transistor, shown as PMOS equalization transistor Q15a, having first and second current carrying terminals (i.e., drain and source) connected to the differential outputs of the master differential amplifier circuit. The PMOS equalization transistor Q15a has a gate that is responsive to the true clock signal CLKa. The precharge circuit may include a pair of PMOS pull-up transistors Q13a and Q14a, connected as illustrated. The gates of the PMOS pull-up transistors Q13a and Q14a are responsive to the true clock signal CLKa. Accordingly, when the true clock signal CLKa transitions from a logic 1 voltage to a logic 0 voltage, the differential outputs of the master differential amplifier circuit will be equilibrated and pulled-up to a logic 1 voltage (shown as Vdd). The master pair of cross-coupled logic gates are illustrated as a pair of two-input NAND gates NAND1a and NAND2a. The first NAND gate NAND1a has a first input connected to one of the differential outputs of the master differential amplifier circuit and a second input connected to the true output OUTM of the master stage 110a. The second NAND gate NAND2a has a first input connected to another one of the differential outputs of the master differential amplifier circuit and a second input connected to the complementary output $OUTB_M$ of the master stage 110a. Reduced hold times may also be simultaneously achieved by reducing the loading on the inputs and outputs of the cross-coupled NAND gates NAND1a and NAND2a. In particular, it is preferred that the first NAND gate NAND1a be identical to the second NAND gate NAND2a by reason that both devices are subjected to the same rise/fall times. The next consideration is for metastability, which relates to the minimum clock pulse needed to toggle the cross-coupled NAND gates. To enhance metastability characteristics, the second input of the first NAND gate NAND1a corresponds to a gate of an uppermost NMOS pull-down transistor (in the gate's pull-down path) having a drain connected to the output of the first NAND gate and the second input of the second NAND gate NAND2a corresponds to a gate of an uppermost NMOS pull-down transistor having a drain connected to the output of the second NAND gate. The sizes of the transistors within the NAND gates are preferably balanced by the devices that drive them and the devices they drive. A process with small channel lengths, minimum capacitance and low voltage swing may be used to improve performance.

The slave stage 110b includes a slave differential amplifier circuit that is responsive to the complementary clock signal CLKb and a slave pair of cross-coupled logic gates having inputs electrically coupled to differential outputs of the slave differential amplifier circuit. The slave differential amplifier circuit and the slave pair of cross-coupled logic gates collectively form a slave latches sense amplifier. The slave differential amplifier circuit includes a NMOS clock enable transistor Q4a, first and second NMOS input transistors Q5a and Q6a and first and second PMOS load transistors Q11a and Q12a. The gates of the NMOS input transistors Q5a and Q6a receive the differential output signals $OUT_M$ and $OUTB_M$ from the master stage 110a. The drains of the first and second PMOS load transistors Q11a and Q12a represent the differential outputs of the slave differential amplifier circuit.

The slave stage 110b also includes an equalization circuit and a precharge circuit. The equalization circuit may include a single equalization transistor, shown as PMOS equalization transistor Q18a, connected to the differential outputs of the slave differential amplifier circuit. The PMOS equalization transistor Q18a has a gate that is responsive to the complementary clock signal CLKb. The precharge circuit may include a pair of PMOS pull-up transistors Q16a and Q17a. The gates of the PMOS pull-up transistors Q16a and Q17a are responsive to the complementary clock signal CLKb. Accordingly, when the complementary clock signal CLKb transitions from a logic 1 voltage to a logic 0 voltage, the differential outputs of the slave differential amplifier circuit will be equilibrated and pulled-up to a logic 1 voltage. The slave pair of cross-coupled logic gates are illustrated as a pair of two-input NAND gates NAND3a and NAND4a. The third NAND gate NAND3a has a first input connected to one of the differential outputs of the slave differential amplifier circuit and a second input connected to the true output $OUT_S$ of the slave stage 110b. The fourth NAND gate NAND4a has a first input connected to another one of the differential outputs of the slave differential amplifier circuit and a second input connected to the complementary output $OUTB_S$ of the slave stage 110b.

As further illustrated by FIG. 3A, NMOS pull-down transistors Q7a and Q8a are utilized to reset the complementary output $OUTB_M$ of the master stage 110a and the complementary output $OUTB_S$ of the slave stage 110b to logic 1 voltages, in response to a rising transition of the active high reset signal RESET from a logic 0 voltage to a logic 1 voltage. As illustrated, this reset of the complementary outputs $OUTB_M$ and $OUTB_S$ to logic 1 voltages causes the outputs CLK2R and CLK2F of the first divide-by-two clock generator 110 to be pulled high and low, respectively.

Figure 3B:
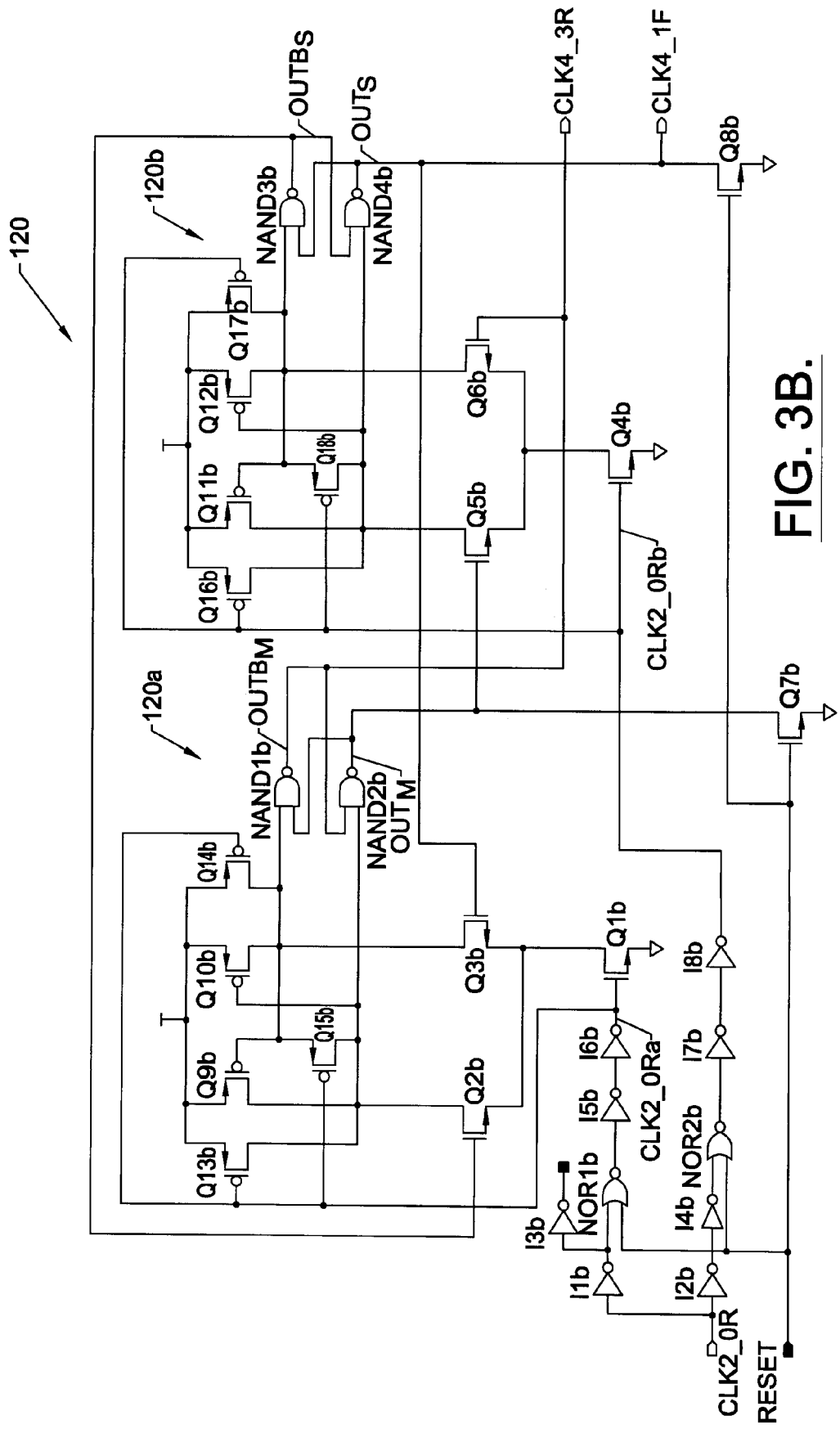

Referring now to FIG. 3B, a preferred embodiment of a second divide-by-two clock generator 120 will be described. This second divide-by-two clock generator 120 generates a second pair of clock signals CLK4_3R and CLK4_1F, in response to the clock signal CLK2_0R and the reset signal RESET. From this clock signal CLK2_0R, an internal pair of complementary clock signals CLK2_0Ra and CLK2_0Rb are generated by circuitry that includes a plurality of inverters 11b–18b and a plurality of NOR gates NOR1b–NOR2b. When the reset signal RESET is set to a logic 0 voltage, a rising transition of the clock signal CLK2_0R will result in a rising transition of the true clock signal CLK2_0Ra and a falling transition of the complementary clock signal CLK2_0Rb. When the active high reset signal RESET transitions from a logic 0 voltage to a logic 1 voltage, both the true clock signal CLK2_0Ra and the complementary clock signal CLK2_0Rb will be pulled (or held) low to a logic 0 voltage independent of the phase of the clock signal CLK2_0R.

The second divide-by-two clock generator 120 includes a master stage 120a and a slave stage 120b that collectively perform the operation of a master-slave flip-flop. The master stage 120a, which is responsive the true clock signal CLK2_0Ra, has a first pair of differential inputs and a first pair of differential outputs $OUT_M$ and $OUTB_M$. The slave stage 120b, which is responsive to the complementary clock signal CLK2_0Rb, has a second pair of differential inputs that are electrically connected to the first pair of differential outputs $OUT_M$ and $OUTB_M$ and a second pair of differential outputs $OUT_S$ and $OUTB_S$ that are cross-coupled and fed back to the first pair of differential inputs of the master stage 120a.

The master stage 120a includes a master differential amplifier circuit that is responsive to the true clock signal CLK2_0Ra and a master pair of cross-coupled logic gates having inputs electrically coupled to differential outputs of the master differential amplifier circuit. The master differential amplifier circuit includes a NMOS clock enable transistor Q1b, first and second NMOS input transistors Q2b and Q3b and first and second PMOS load transistors Q9b and Q10b, connected as illustrated. The gates of the NMOS input transistors Q2b and Q3b receive the differential input signals to the master stage 120a. The drains of the first and second PMOS load transistors Q9b and Q10b represent the differential outputs of the master differential amplifier circuit.

The master stage 120a also includes an equalization circuit and a precharge circuit. The equalization circuit may include a single equalization transistor, shown as PMOS equalization transistor Q15b, having first and second current carrying terminals (i.e., drain and source) connected to the differential outputs of the master differential amplifier circuit. The PMOS equalization transistor Q15b has a gate that is responsive to the true clock signal CLK2_0Ra. The precharge circuit may include a pair of PMOS pull-up transistors Q13b and Q14b, connected as illustrated. The gates of the PMOS pull-up transistors Q13b and Q14b are also responsive to the true clock signal CLK2_0Ra. Accordingly, when the true clock signal CLK2_0Ra transitions from a logic 1 voltage to a logic 0 voltage, the differential outputs of the master differential amplifier circuit will be equilibrated and pulled-up to a logic 1 voltage (shown as Vdd). The master pair of cross-coupled logic gates are illustrated as a pair of two-input NAND gates NAND1b and NAND2b. The first NAND gate NAND1b has a first input connected to one of the differential outputs of the master differential amplifier circuit and a second input connected to the true output $OUT_M$ of the master stage 120a. The second NAND gate NAND2 has a first input connected to another one of the differential outputs of the master differential amplifier circuit and a second input connected to the complementary output $OUTB_M$ of the master stage 120a.

The slave stage 120b includes a slave differential amplifier circuit that is responsive to the complementary clock signal CLK2_0Rb and a slave pair of cross-coupled logic gates having inputs electrically coupled to differential outputs of the slave differential amplifier circuit. The slave differential amplifier circuit includes a NMOS clock enable transistor Q4b, first and second NMOS input transistors Q5b and Q6b and first and second PMOS load transistors Q1b and Q12b. The gates of the NMOS input transistors Q5b and Q6b receive the differential output signals $OUT_M$ and $OUTB_M$ from the master stage 120a. The drains of the first and second PMOS load transistors Q11b and Q12b represent the differential outputs of the slave differential amplifier circuit.

The slave stage 120b also includes an equalization circuit and a precharge circuit. The equalization circuit may include a single equalization transistor, shown as PMOS equalization transistor Q18b, connected to the differential outputs of the slave differential amplifier circuit. The PMOS equalization transistor Q18b has a gate that is responsive to the complementary clock signal CLK2-0Rb. The precharge circuit may include a pair of PMOS pull-up transistors Q16b and Q17b. The gates of the PMOS pull-up transistors Q16b and Q17b are also responsive to the complementary clock signal CLK2__0Rb. Accordingly, when the complementary clock signal CLK2__0Rb transitions from a logic 1 voltage to a logic 0 voltage, the differential outputs of the slave differential amplifier circuit will be equilibrated and pulled-up to a logic 1 voltage. The slave pair of cross-coupled logic gates are illustrated as a pair of two-input NAND gates NAND3b and NAND4b. The third NAND gate NAND3b has a first input connected to one of the differential outputs of the slave differential amplifier circuit and a second input connected to the true output $OUT_S$ of the slave stage 120b. The fourth NAND gate NAND4b has a first input connected to another one of the differential outputs of the slave differential amplifier circuit and a second input connected to the complementary output $OUTB_S$ of the slave stage 120b.

As further illustrated by FIG. 3B, NMOS pull-down transistors Q7b and Q8b are utilized to reset the complementary output $OUTB_M$ of the master stage 120a and the complementary output $OUTB_S$ of the slave stage 120b to logic 1 voltages, in response to a rising transition of the active high reset signal RESET from a logic 0 voltage to a logic 1 voltage. This reset of the complementary outputs $OUTB_M$ and $OUTB_S$ to logic 1 voltages causes the clock outputs CLK2R and CLK2F of the second divide-by-two clock generator 120 to be pulled high and low, respectively. Thus, in response to a rising transition of the reset signal RESET, clock signals CLK4__3R and CLK4__1F will be set to (or held at) logic 1 and logic 0 voltages, respectively.

Figure 3C:
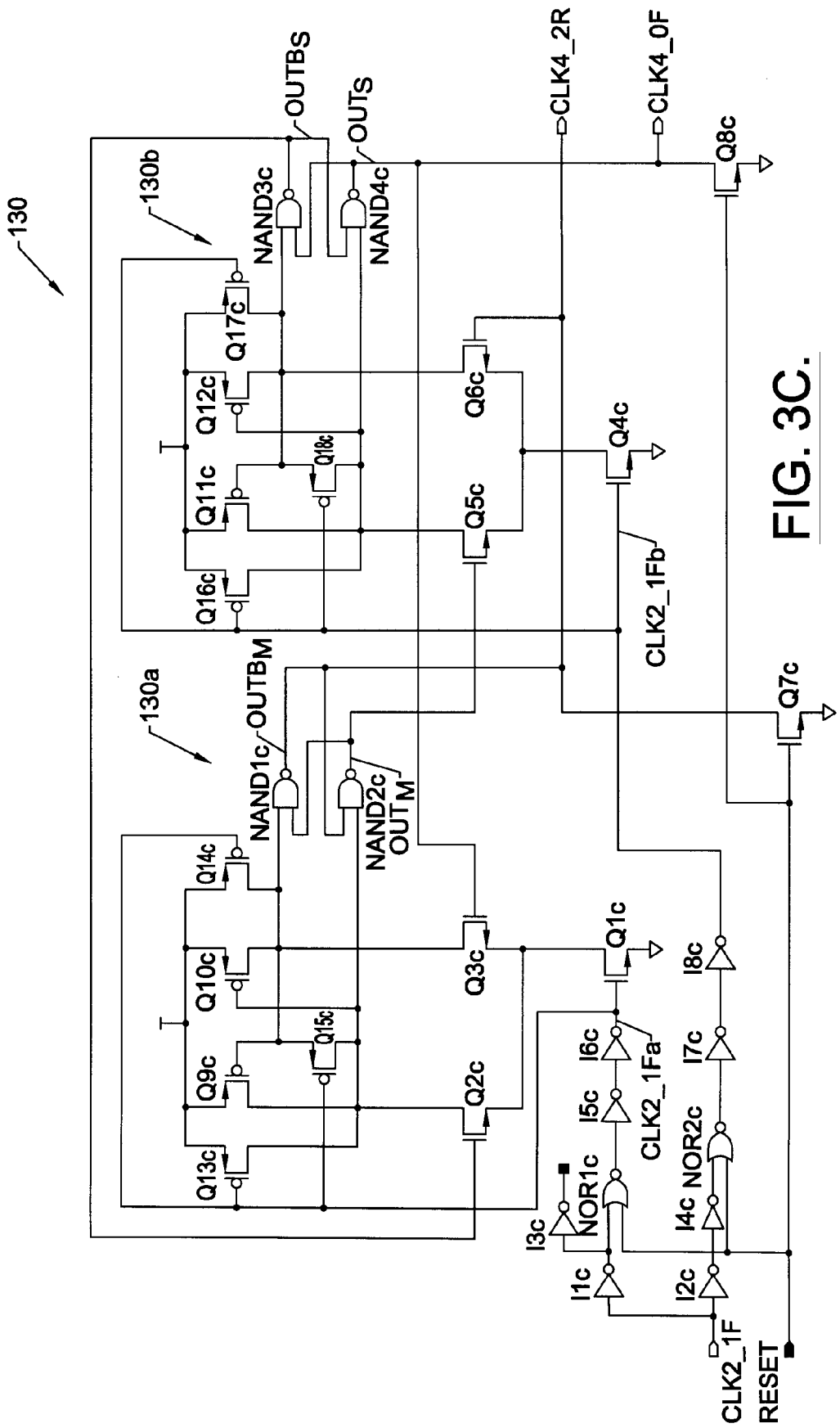

Referring now to FIG. 3C, a preferred embodiment of a third divide-by-two clock generator 130 according to the present invention will be described. This third divide-by-two clock generator 130 generates a third pair of clock signals CLK4__2R and CLK4__0F, in response to the clock signal CLK2__1F and the reset signal RESET. From this clock signal CLK2__1F, an internal pair of complementary clock signals CLK2__1Fa and CLK2__1Fb are generated by circuitry that. includes a plurality of inverters 11c–18c and a plurality of NOR gates NOR1c–NOR2c. When the active high reset signal RESET transitions from a logic 0 voltage to a logic 1 voltage, both the true clock signal CLK2__1Fa and the complementary clock signal CLK2__1Fb will be pulled (or held) low to a logic 0 voltage independent of the phase of the clock signal CLK2__1F.

The third divide-by-two clock generator 130 includes a master stage 130a and a slave stage 130b that. collectively perform the operation of a master-slave flip-flop. The master stage 130a, which is responsive the true clock signal CLK2__1Fa, has a first pair of differential inputs and a first pair of differential outputs $OUT_M$ and $OUTB_M$. The slave stage 130b, which is responsive to the complementary clock signal CLK2__1Fb, has a second pair of differential inputs that are electrically connected to the first pair of differential outputs $OUT_M$ and $OUTB_M$ and a second pair of differential outputs $OUT_S$ and $OUTB_S$ that are cross-coupled and fed back to the first pair of differential inputs of the master stage 130a.

The master stage 130a includes a master differential amplifier circuit that is responsive to the true clock signal CLK2__1Fa and a master pair of cross-coupled logic gates having inputs electrically coupled to differential outputs of the master differential amplifier circuit. The master differential amplifier circuit includes a NMOS clock enable transistor Q1c, first and second NMOS input transistors Q2c and Q3c and first and second PMOS load transistors Q9c and Q10c. The gates of the NMOS input transistors Q2c and Q3c receive the differential input signals to the master stage 130a. The drains of the first and second PMOS load transistors Q9c and Q10c represent the differential outputs of the master differential amplifier circuit.

The master stage 130a also includes an equalization circuit and a precharge circuit. The equalization circuit may include a single equalization transistor, shown as PMOS equalization transistor Q15c. The PMOS equalization transistor Q15c has a gate that is responsive to the true clock signal CLK2__1Fa. The precharge circuit may include a pair of PMOS pull-up transistors Q13c and Q14c, connected as illustrated. The gates of the PMOS pull-up transistors Q13c and Q14c are responsive to the true clock signal CLK2__1Fa. Accordingly, when the true clock signal CLK2__1Fa transitions from a logic 1 voltage to a logic 0 voltage, the differential outputs of the master differential amplifier circuit will be equilibrated and pulled-up to a logic 1 voltage (shown as Vdd). The master pair of cross-coupled logic gates are illustrated as a pair of two-input NAND gates NAND1c and NAND2c. The first NAND gate NAND1c has a first input connected to one of the differential outputs of the master differential amplifier circuit and a second input connected to the true output $OUT_M$ of the master stage 130a. The second NAND gate NAND2c has a first input connected to another one of the differential outputs of the master differential amplifier circuit and a second input connected to the complementary output $OUTB_M$ of the master stage 130a.

The slave stage 130b includes a slave differential amplifier circuit that is responsive to the complementary clock signal CLK2__1Fb and a slave pair of cross-coupled logic gates having inputs electrically coupled to differential outputs of the slave differential amplifier circuit. The slave differential amplifier circuit includes a NMOS clock enable transistor Q4c, first and second NMOS input transistors Q5c and Q6c and first and second PMOS load transistors Q11c and Q12c. The gates of the NMOS input transistors Q5c and Q6c receive the differential output signals $OUT_M$ and $OUTB_M$ from the master stage 130a. The drains of the first and second PMOS load transistors Q11c and Q12c represent the differential outputs of the slave differential amplifier circuit.

The slave stage 130b also includes an equalization circuit and a precharge circuit. The equalization circuit may include a single equalization transistor, shown as PMOS equalization transistor Q18c. The PMOS equalization transistor Q18c has a gate that is responsive to the complementary clock signal CLK2__1Fb. The precharge circuit may include a pair of PMOS pull-up transistors Q16c and Q17c, connected as illustrated. The gates of the PMOS pull-up transistors Q16c and Q17c are responsive to the complementary clock signal CLK2__1Fb. When the complementary clock signal CLK2__1Fb transitions from a logic 1 voltage to a logic 0 voltage, the differential outputs of the slave differential amplifier circuit will be equilibrated and pulled-up to a logic 1 voltage. The slave pair of cross-coupled logic gates are illustrated as a pair of two-input NAND gates NAND3c and NAND4c. The third NAND gate NAND3c has a first input connected to one of the differential outputs of the slave differential amplifier circuit and a second input connected to the true output $OUT_S$ of the slave stage 130b. The fourth NAND gate NAND4c has a first input connected to another one of the differential outputs of the slave differential amplifier circuit and a second input connected to the complementary output $OUTB_S$ of the slave stage 130b.

As further illustrated by FIG. 3C, NMOS pull-down transistors Q7c and Q8c are utilized to set the complementary output $OUTB_M$ of the master stage 130a and the true output $OUT_S$ of the slave stage 130b at logic 0 voltages, in response to a transition of the active high reset signal RESET from a logic 0 voltage to a logic 1 voltage. This reset of the complementary output $OUTB_M$ and true output $OUT_S$ to logic 0 voltages causes both the clock outputs CLK4_2R and CLK4_0F of the third divide-by-two clock generator 130 to be pulled low. Accordingly, regardless of the state of the primary clock signal CLK, a rising transition of the active high reset signal RESET will cause the clock signals generated by the second and third divide-by-two clock generators 120 and 130 to reset to CLK4_3R=1, CLK4_1F=0, CLK4_2R=0 and CLK4_0F=0.

Figure 4:
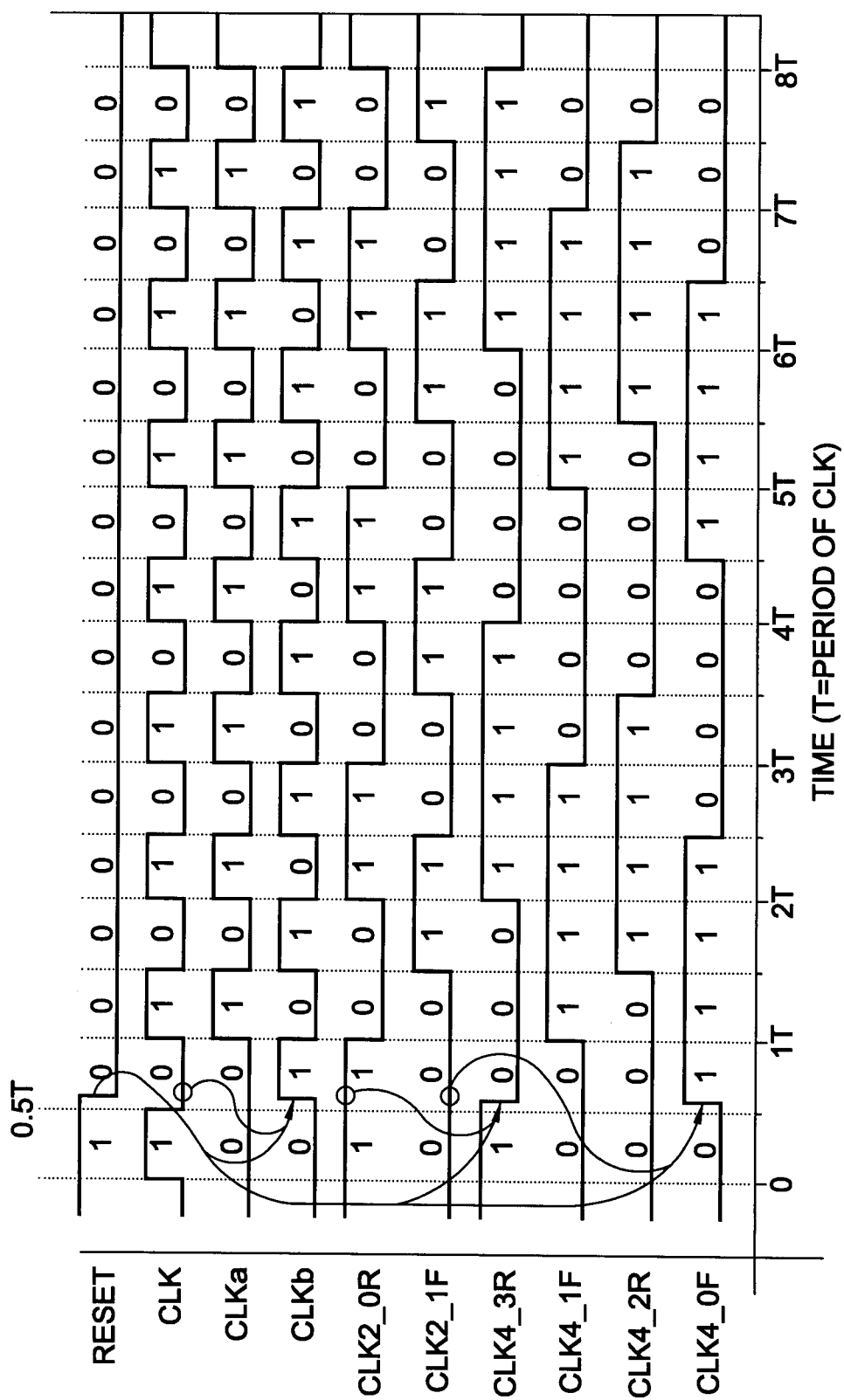
FIG. 4 is a timing diagram that illustrates operation of the clock generator of FIGS. 2 and 3A–3C.

Referring now to the timing diagram of FIG. 4 and the divide-by-two clock generator circuits 110, 120 and 130 of FIGS. 3A–3C, the operation of the four phase clock generator 100 of FIG. 2 will be more fully described. In particular, a rising transition of the active high reset signal RESET will cause the true and complementary clock signals CLKa and CLKb of FIG. 3A and the true outputs $OUT_M$ and $OUT_S$ of the master and slave stages 110a–110b to switch (or be held) low. Switching the true outputs $OUT_M$ and $OUT_S$ of the master and slave stages 110a–110b low will cause clock signals. CLK2_0R and CLK2_1F to switch high and low, respectively. In response to switching the true and complementary clock signals CLKa and CLKb low, the precharge and equalization circuits within the master and slave stages 110a and 110b will operate to pull the drains of NMOS input transistors Q2a, Q3a, Q5a and Q6a high. Thus, the complementary outputs $OUTB_M$ and OUTBS of the master and slave stages 110a and 110b will be latched at logic 1 voltages by operation of the cross-coupled NAND gates NAND1a, NAND2a, NAND3a and NAND4a. Latching the complementary outputs $OUTB_M$ and $OUTB_S$ of the master and slave stages 110a and 110b at logic 1 voltages will also operate to precharge the sources of NMOS input transistors Q2a, Q3a, Q5a and Q6a at voltages equal to Vdd-Vth, where Vth is the threshold voltage of the NMOS input transistors.

In the event the reset signal RESET undergoes a falling transition while the primary clock signal CLK is low, the complementary clock signal CLKb will switch high and pull the drain of the NMOS input transistor Q6a from a precharged logic 1 voltage to a logic 0 voltage. However, this will not result in a change in the states of the true and complementary outputs of the master and slave stages 110a and 110b, because the master stage 110a will be held inactive by a low clock (CLKa=0) and the output ($OUTB_S$) of the NAND gate NAND3a in the slave stage 110b will already be pulled high because the true output $OUT_S$ has been latched low by operation of the earlier rising transition of the active high reset signal RESET. Alternatively, if the reset signal RESET undergoes a falling transition while the primary clock signal CLK is high, the slave stage 110b will remain inactive and the true clock signal CLKa will switch high. This transition of the true clock signal CLKa high will operate to pull the drain of the NMOS input transistor Q2a from a precharged logic 1 voltage to a logic 0 voltage. This will cause the true output $OUT_M$ of the master stage 110a to switch from low to high and the complementary output $OUTB_M$ to switch from high to low, thereby switching clock signal CLK2_0R from high to low in-sync with the falling edge of the reset signal RESET.

Referring now specifically to the timing diagram of FIG. 4, the falling transition of the reset signal RESET during an interval when the primary clock signal CLK is low, will cause the complementary clock signal CLKb and the clock signal CLK4_0F to switch from low to high and the clock signal CLK4_3R to switch from high to low. Next, a low to high transition of the primary clock signal CLK will trigger a low to high transition of the true clock signal CLKa and clock signal CLK4_1f and a high to low transition of the complementary clock signal CLKb and clock signal CLK2_0R, as illustrated. Thereafter, the clock signals CLK2_0R and CLK2_1F generated by the first divide-by-two clock generator 110 will track rising and falling edges of the primary clock signal CLK, respectively. The clock signals CLK4_3R and CLK4_1F at the outputs of the second divide-by-two clock generator 120 will track rising and falling edges of the clock signal CLK2_0R, respectively, and the clock signals CLK4_2R and CLK4_0F at the outputs of the third divide-by-two clock generator 130 will track rising and falling edges of the clock signal CLK2_1F.

Figure 5:
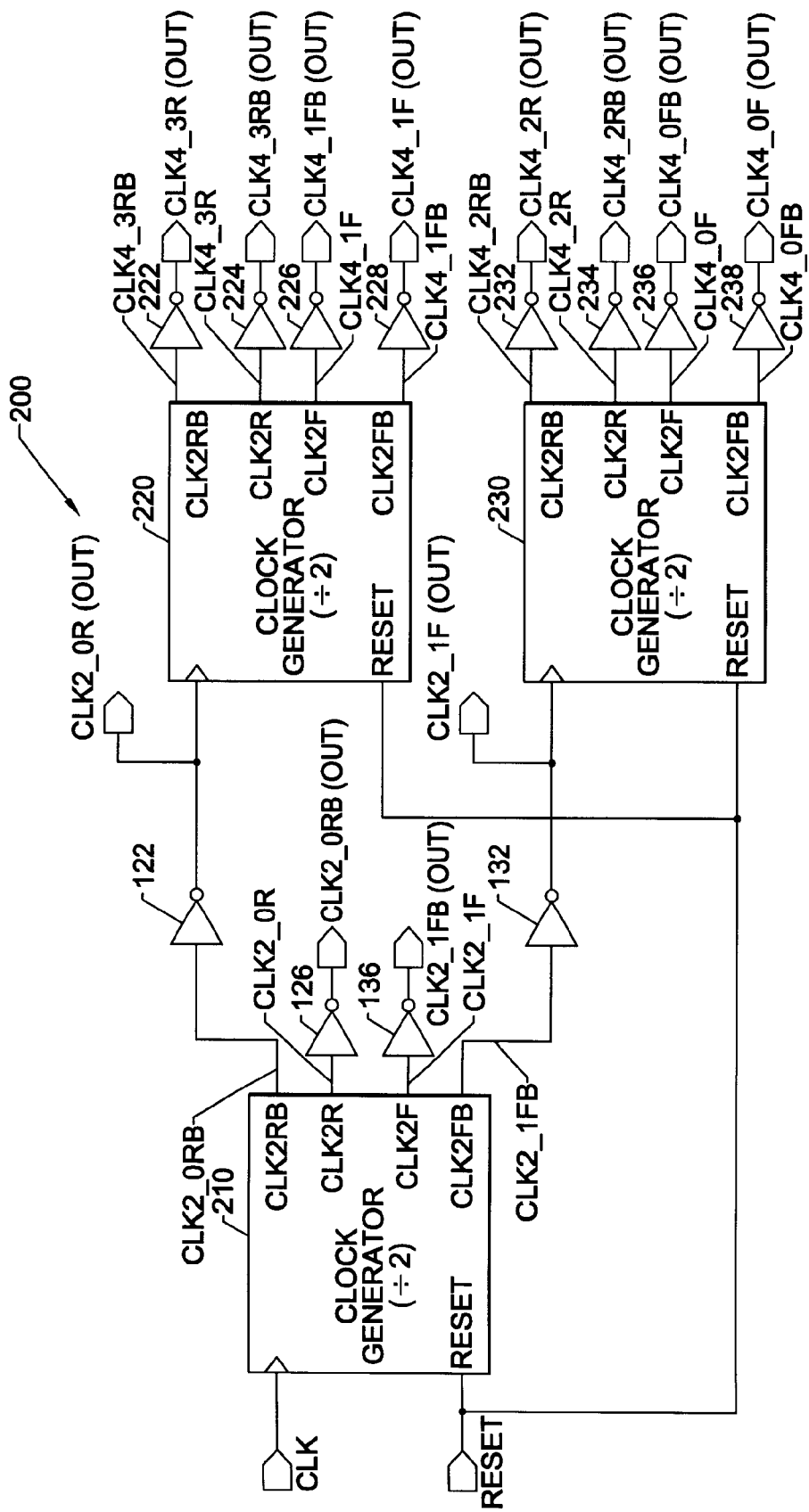
FIG. 5 is a block diagram of a four phase clock generator according to another embodiment of the present invention.

Referring now to FIG. 5, a four phase clock generator 200 according to another embodiment of the present invention includes first, second and third divide-by-two clock generators 210, 220 and 230 connected as illustrated. As explained more fully hereinbelow with respect to FIGS. 6A–6C, the four phase clock generator 200 of FIG. 5 may have more symmetric timing characteristics relative to the clock generator 100 of FIG. 2. The first divide-by-two clock generator 210 is responsive to a primary clock signal CLK and a reset signal RESET. In response to the primary clock signal CLK, the first divide-by-two clock generator 210 generates two pairs of complementary clock signals (CLK2_0R, CLK2_0RB) and (CLK2_1F, CLK2_1FB), as illustrated. As described more fully hereinbelow with respect to FIG. 6A, the clock signals CLK2_0R and CLK2_0RB have a period that is twice as long as the period of the primary clock signal CLK, with each rising and falling transition of these signals occurring in-sync with a respective rising edge of the primary clock signal CLK. The clock signals CLK2_1F and CLK2_1FB also have a period that is twice as long as the period of the primary clock signal CLK, with each rising and falling transition of these signals occurring in-sync with a respective falling edge of the primary clock signal CLK. As illustrated, the clock signals generated by the first divide-by-two clock generator 210 are provided to respective inverters 122, 126, 136 and 132.

The second divide-by-two clock generator 220 generates two pairs of clock signals (CLK4_3R, CLK4_3RB) and (CLK4_1F and CLK4_1FB) in response to the clock signal CLK2_0R(OUT) generated at the output of inverter 122. The third divide-by-two clock generator 230 generates two pairs of clock signals (CLK4_2R, CLK4_2RB) and (CLK4 OF and CLK4_0FB) in response to the clock signal CLK2_1F(OUT) generated at the output of inverter 132. The clock signals generated by the second and third divide-by-two clock generators 220 and 230 may be provided to respective inverters 222, 224, 226 and 228 and 232, 234, 236 and 238, as illustrated. As described more fully hereinbelow with respect to FIGS. 6A–6C, the timing of clock signal CLK2_0R(OUT) at the clock input of the second divide-by-two clock generator 220 is similar to the timing of clock signal CLK2_0R illustrated by FIG. 4. The timing of clock signal CLK2_1F(OUT) at the clock input of the third divide-by-two clock generator 230 is similar to the timing of clock signal CLK2_1F illustrated by FIG. 4. Similarly, the timing of clock signals CLK4_3R(OUT), CLK4_1F(OUT), CLK4_2R(OUT) and CLK4_0F(OUT) correspond to the timing of clock signals CLK4_3R, CLK4_1F. CLK4_2R and CLK4_0F of FIG. 4. Clock signals CLK4_3RB (OUT), CLK4_1FB(OUT), CLK4_2RB(OUT) and CLK4_0FB(OUT) are complementary clock signals relative to respective clock signals CLK4_3R(OUT), CLK4_1F(OUT), CLK4_2R(OUT) and CLK4_0F(OUT).

Figure 6A:
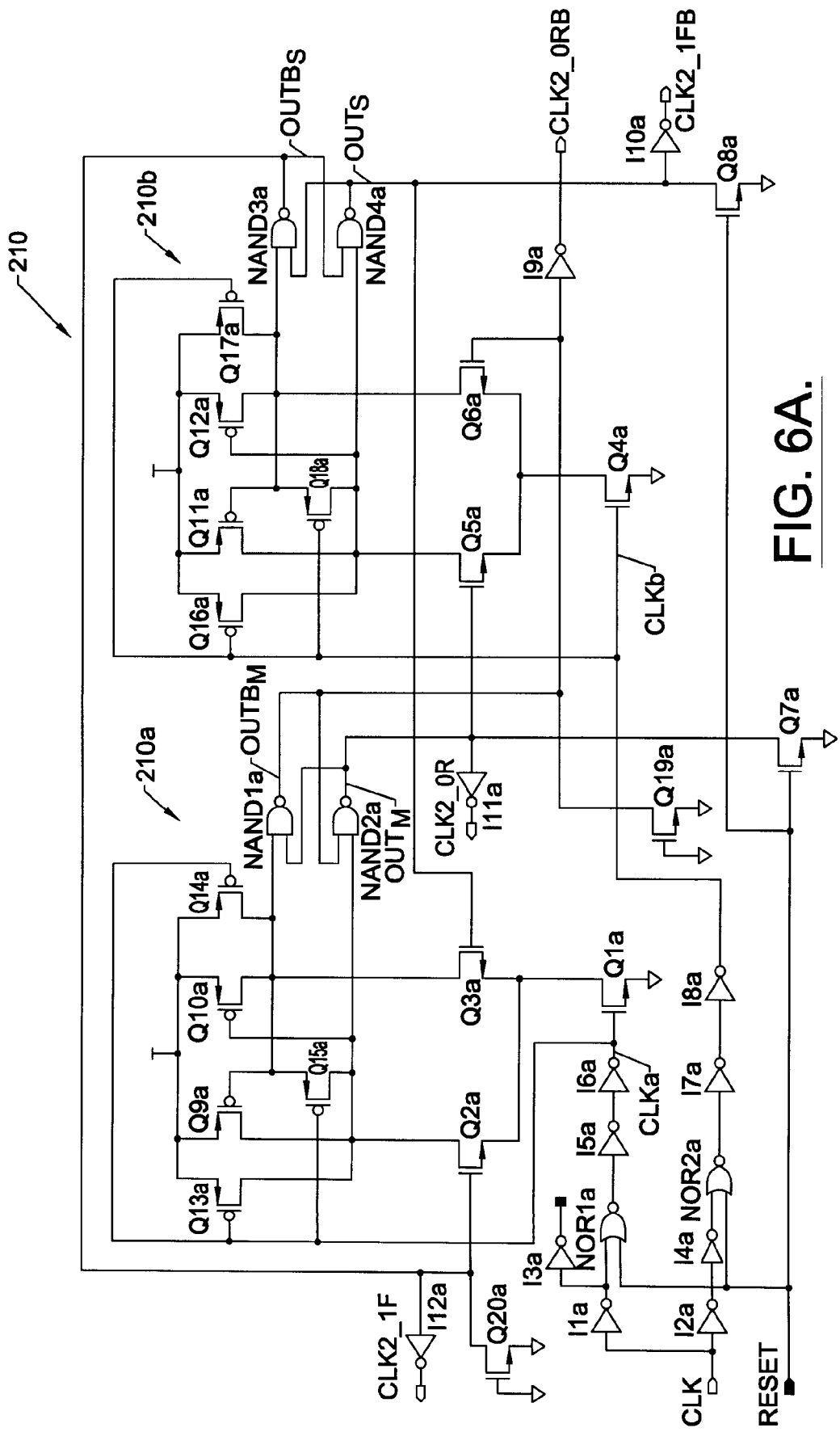
FIGS. 6A–6C are electrical schematics of divide-by-two clock generators that can be used in the four phase clock generator of FIG. 5.

FIG. 6A illustrates a divide-by-two clock generator 210 that is similar to the divide-by-two clock generator 110 of FIG. 3A, however, the true and complementary outputs (OUTB$_M$ and OUT$_M$) of the master stage 210a have more symmetric timing characteristics relative to the same outputs illustrated by the master stage 110a of FIG. 3A. This higher degree of symmetry is achieved by making the loading on the output of the first NAND gate NAND1a equal (i.e., matched) to the loading on the output of the second NAND gate NAND2a. This loading equality is achieved by connecting the complementary output OUTB$_M$ of the master stage 210a to a drain of an always off NMOS pull-down transistor Q19a and an input of a driving inverter 19a (and a gate of NMOS transistor Q6a), and connecting the true output OUT$_M$ of the master stage 210a to a drain of a normally off NMOS pull-down transistor Q7a and an input of a driving inverter 111a (and a gate of NMOS transistor Q5a). The true and complementary outputs (OUTB$_S$ and OUT$_S$) of the slave stage 210b also have more symmetric timing characteristics relative to the same outputs illustrated by the slave stage 110b of FIG. 3A. This higher degree of symmetry is achieved by making the loading on the output of the third NAND gate NAND3a equal to the loading on the output of the fourth NAND gate NAND4a. This loading equality is achieved by connecting the complementary output OUTB$_S$ of the slave stage 210b to a drain of an always off NMOS pull-down transistor Q20a and an input of a driving inverter 112a, and connecting the true output OUT$_S$ of the slave stage 210b to a drain of a normally off NMOS pull-down transistor Q8a and an input of a driving inverter 110a.

Figure 6B:
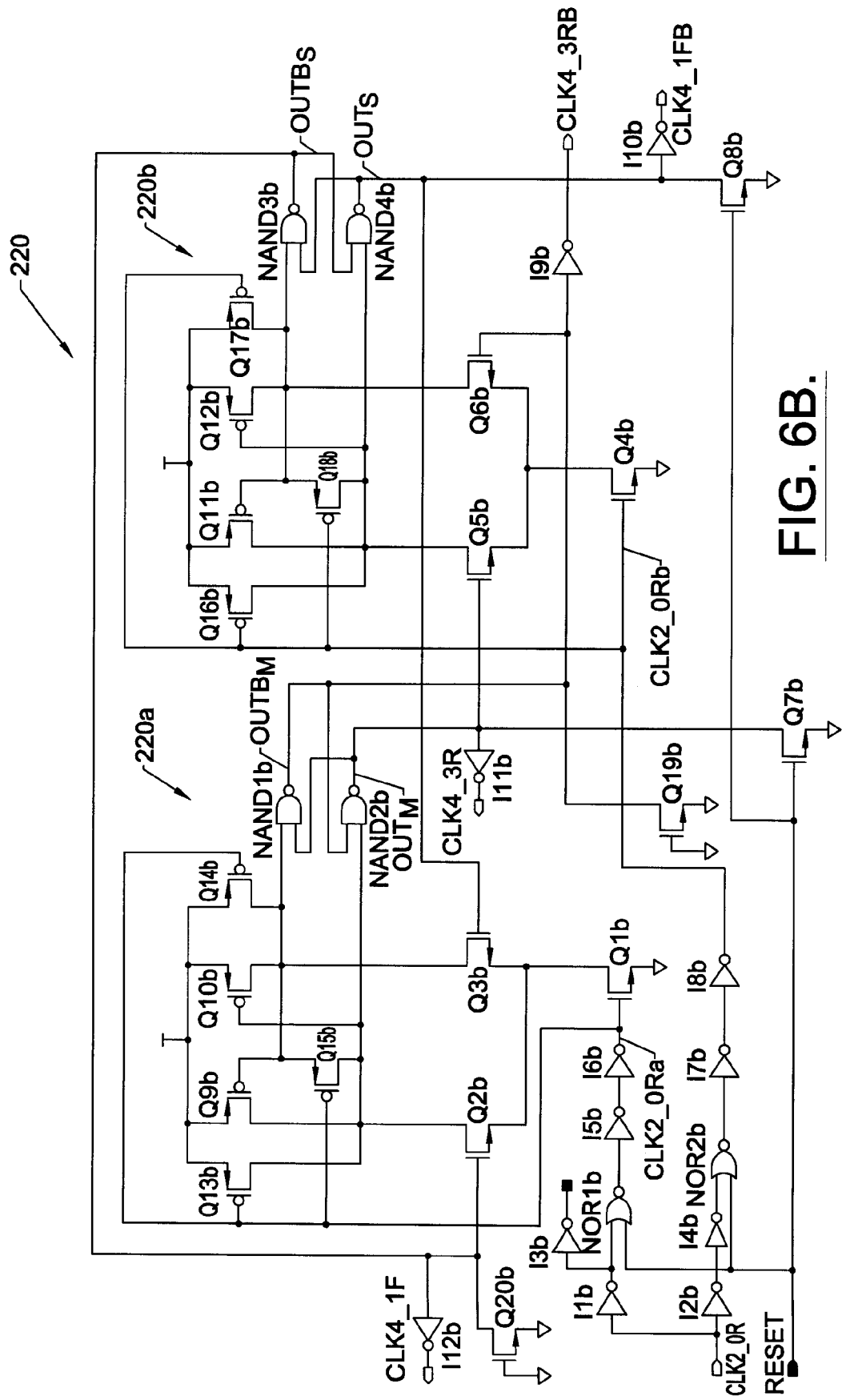

FIG. 6B illustrates a divide-by-two clock generator 220 that is similar to the divide-by-two clock generator 120 of FIG. 3B, however, the true and complementary outputs (OUTB$_M$ and OUT$_M$) of the master stage 222a have more symmetric timing characteristics relative to the same outputs illustrated by the master stage 120a of FIG. 3A. This higher degree of symmetry is achieved by making the loading on the output of the first NAND gate NAND1b equal to the loading on the output of the second NAND gate NAND2b. This loading equality is achieved by connecting the complementary output OUTB$_M$ of the master stage 220a to a drain of an always off NMOS pull-down transistor Q19b and an input of a driving inverter 19b and connecting the true output OUT$_M$ of the master stage 220a to a drain of a normally off NMOS pull-down transistor Q7b and an input of a driving inverter 111b. The true and complementary outputs (OUTB$_S$ and OUT$_S$) of the slave stage 220b also have more symmetric timing characteristics relative to the same outputs illustrated by the slave stage 120b of FIG. 3A. This higher degree of symmetry is achieved by making the loading on the output of the third NAND gate NAND3b equal to the loading on the output of the fourth NAND gate NAND4b. This loading equality is achieved by connecting the complementary output OUTB$_S$ of the slave stage 220b to a drain of an always off NMOS pull-down transistor Q20b and an input of a driving inverter 112b and connecting the true output OUT$_S$ of the slave stage 220b to a drain of a normally off NMOS pull-down transistor Q8b and an input of a driving inverter 110b.

Figure 6C:
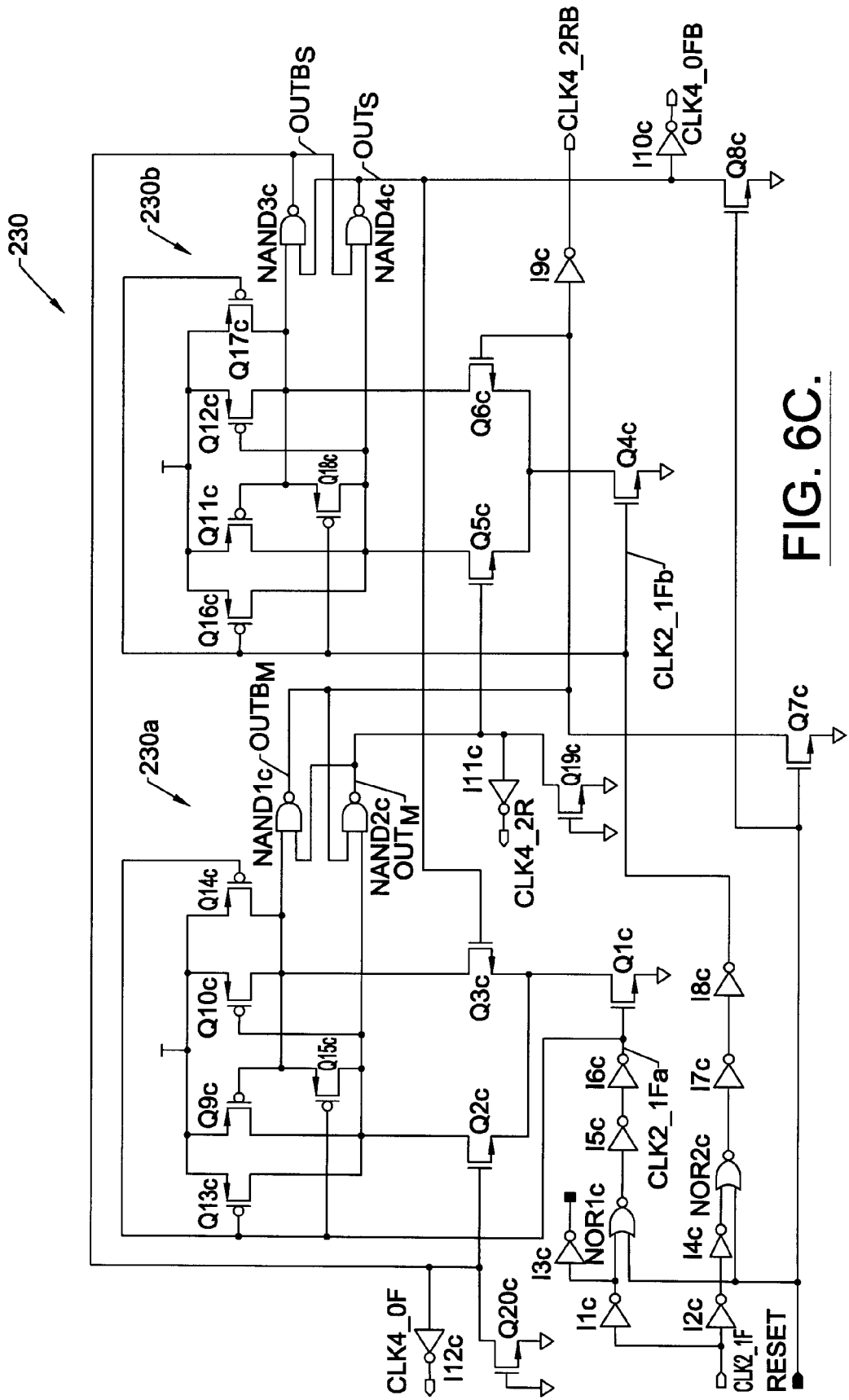

FIG. 6C illustrates a divide-by-two clock generator 230 that is similar to the divide-by-two clock generator 130 of FIG. 3C, however, the true and complementary outputs (OUTB$_M$ and OUT$_M$) of the master stage 230a have more symmetric timing characteristics relative to the same outputs illustrated by the master stage 130a of FIG. 3C. This higher degree of symmetry is achieved by making the loading on the output of the first NAND gate NAND1c equal to the loading on the output of the second NAND gate NAND2c. This loading equality is achieved by connecting the complementary output OUTB$_M$ of the master stage 230a to a drain of a normally off NMOS pull-down transistor Q7c and an input of a driving inverter 19c, and connecting the true output OUT$_M$ of the master stage 230a to a drain of an always off NMOS pull-down transistor Q19c and an input of a driving inverter 111c. The true and complementary outputs (OUTB$_S$ and OUT$_S$) of the slave stage 230b also have more symmetric timing characteristics relative to the same outputs illustrated by the slave stage 130b of FIG. 3A. This higher degree of symmetry is achieved by making the loading on the output of the third NAND gate NAND3c equal to the loading on the output of the fourth NAND gate NAND4c. This loading equality is achieved by connecting the complementary output OUTB$_S$ of the slave stage 230b to a drain of an always off NMOS pull-down transistor Q20c and an input of a driving inverter 112c, and connecting the true output OUT$_S$ of the slave stage 230b to a drain of a normally off NMOS pull-down transistor Q8a and an input of a driving inverter 110c.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A multi-phase clock generator, comprising:
   a master-slave flip flop that is configured to generate a second pair of clock signals having a second frequency in response to a first pair of clock signals having a first frequency greater than the second frequency, said master-slave flip-flop comprising:
      a master stage that is responsive to a first one of the first pair of clock signals and has a first pair of differential inputs and a first pair of differential outputs, said master stage comprising:
         a master differential amplifier circuit that is responsive to the first one of the first pair of clock signals and comprises a first pair of input transistors; and
         a master pair of cross-coupled logic gates that each have an input electrically connected to a current carrying terminal of a respective one of the first pair of input transistors; and
      a slave stage that is responsive to a second one of the first pair of clock signals and has a second pair of differential inputs coupled to the first pair of differential outputs and a second pair of differential outputs that are cross-coupled to the first pair of differential inputs.

2. The clock generator of claim 1, wherein the first pair of clock signals is a first pair of complementary clock signals.

3. The clock generator of claim 2, wherein said slave stage comprises:
   a slave differential amplifier circuit that is responsive to a complementary one of the first pair of complementary clock signals; and
   a slave pair of cross-coupled logic gates having inputs electrically coupled to differential outputs of said slave differential amplifier circuit.

4. The clock generator of claim 2, wherein said master stage comprises an equalization circuit that is responsive to a true one of the first pair of complementary clock signals and is electrically coupled across the differential outputs of said master differential amplifier circuit.

5. The clock generator of claim 2, wherein said master stage comprises:
   an equalization circuit that is responsive to a true one of the first pair of complementary clock signals and is electrically coupled across the differential outputs of said master differential amplifier circuit; and
   a precharge circuit that is responsive to the true one of the first pair of complementary clock signals and comprises a pair of PMOS pull-up transistors electrically coupled to the differential outputs of said master differential amplifier circuit.

6. The clock generator of claim 3, wherein said master pair of cross-coupled logic gates and said slave pair of cross-coupled logic gates are two-input NAND gates.

7. A multi-phase clock generator, comprising:
   a clock generator that is configured to generate true and complementary clock signals;
   a master latched sense amplifier that is responsive to the true clock signal and has a first pair of differential inputs and a first pair of latched differential outputs;
   a slave latched sense amplifier that is responsive to the complementary clock signal and has a second pair of differential inputs electrically coupled to the first pair of latched differential outputs and a second pair of latched differential outputs electrically cross-coupled to the first pair of differential inputs;
   a first MOS transistor having a first current carrying terminal electrically connected to one of the first pair of latched differential outputs and a gate responsive to a reset signal; and
   a second MOS transistor having a first current carrying terminal electrically connected to one of the second pair of latched differential outputs and a gate responsive to the reset signal.

8. The clock generator of claim 7, wherein said master latched sense amplifier comprises:
   a master differential amplifier circuit that is responsive to the true clock signal; and
   a master pair of cross-coupled logic gates having inputs electrically coupled to differential outputs of said master differential amplifier circuit.

9. The clock generator of claim 8, further comprising:
   an equalization circuit that is responsive to the true clock signal and is electrically coupled across the differential outputs of said master differential amplifier circuit; and
   a precharge circuit that is responsive to the true clock signal and comprises a pair of PMOS pull-up transistors electrically coupled to the differential outputs of said master differential amplifier circuit.

10. A multi-phase clock generator, comprising:
    a clock generator that is configured to generate true and complementary clock signals;
    a master latched sense amplifier that is responsive to the true clock signal and has a first pair of differential inputs and a first pair of latched differential outputs that have equivalent RC loading characteristics;
    a slave latched sense amplifier that is responsive to the complementary clock signal and has a second pair of differential inputs electrically coupled to the first pair of latched differential outputs and a second pair of latched differential outputs that have equivalent RC loading characteristics and are electrically cross-coupled to the first pair of differential inputs; and
    means, responsive to a reset signal, for shorting one of the first pair of latched differential outputs and one of the second pair of latched differential outputs to a ground reference voltage.

11. A multi-phase clock generator, comprising:
    a master latched sense amplifier that is responsive to a true clock signal and has a first pair of differential inputs and a first pair of latched differential outputs;
    a slave latched sense amplifier that is responsive to a complementary clock signal and has a second pair of differential inputs electrically coupled to the first pair of latched differential outputs and a second pair of latched differential outputs that are electrically cross-coupled to the first pair of differential inputs; and
    means, responsive to a reset signal, for shorting one of the first pair of latched differential outputs and one of the second pair of latched differential outputs to a ground reference voltage.

12. The clock generator of claim 11, further comprising:
    a first divide-by-two clock generator having a clock input electrically coupled to a complementary one of the first pair of latched differential outputs; and
    a second divide-by-two clock generator having a clock input electrically coupled to a true one of the second pair of latched differential outputs.

13. The clock generator of claim 11, further comprising:
    a clock generator that is configured to generate the true and complementary clock signals and is responsive to the reset signal.

14. The clock generator of claim 11, further comprising:
    a first inverter having an input electrically connected to a true one of the first pair of latched differential outputs;
    a second inverter having an input electrically connected to a complementary one of the first pair of latched differential outputs;
    a third inverter having an input electrically connected to a true one of the second pair of latched differential outputs; and
    a fourth inverter having an input electrically connected to a complementary one of the second pair of latched differential outputs.

15. The clock generator of claim 14, further comprising:
    a first divide-by-two clock generator having a clock input electrically coupled to an output of one of the first, second, third or fourth inverters; and
    a second divide-by-two clock generator having a clock input electrically coupled to an output of another one of the first, second, third or fourth inverters.

16. A clock signal generator, comprising:
    a master-slave flip flop that is configured to generates a second pair of clock signals having a second frequency in response to a first pair of clock signals having a first frequency greater than the second frequency, said master-slave flip-flop comprising:
       a master stage that is responsive to a first one of the first pair of clock signals and has a first pair of differential inputs and a first pair of differential outputs, said master stage comprising:
          a master differential amplifier circuit that is responsive to the first one of the first pair of clock signals and comprises a first pair of input transistors; and a master pair of cross-coupled logic gates that each have an input electrically connected to a current carrying terminal of a respective one of the first pair of input transistors;

a slave stage that is responsive to a second one of the first pair of clock signals and has a second pair of differential inputs coupled to the first pair of differential outputs and a second pair of differential outputs that are cross-coupled to the first pair of differential inputs;

a first divide-by-two clock generator having a clock input electrically coupled to a complementary one of the first pair of differential outputs; and a second divide-by-two clock generator having a clock input electrically coupled to a true one of the second pair of differential outputs.

17. The clock generator of claim 16, further comprising:

a first pair of inverters electrically connected in series between the complementary one of the first pair of differential outputs and the clock input of said first divide-by-two clock generator; and a second pair of inverters electrically connected in series between the true one of the second pair of differential outputs and said second divide-by-two clock generator.

\* \* \* \* \*